US006871316B1

United States Patent
Wong et al.

(10) Patent No.: US 6,871,316 B1
(45) Date of Patent: Mar. 22, 2005

(54) DELAY REDUCTION OF HARDWARE IMPLEMENTATION OF THE MAXIMUM A POSTERIORI (MAP) METHOD

(75) Inventors: Alfred Kwok-Kit Wong, Pokfulam (HK); Cheng Qian, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 443 days.

(21) Appl. No.: 10/060,526

(22) Filed: Jan. 30, 2002

(51) Int. Cl.[7] .............................................. H03M 13/00
(52) U.S. Cl. .................................................... 714/796
(58) Field of Search ......................... 714/786, 791–796; 374/341, 265

(56) References Cited

U.S. PATENT DOCUMENTS

| 5,418,795 | A | * | 5/1995 | Itakura et al. ............... 714/746 |
| 6,189,126 | B1 | * | 2/2001 | Ulmer et al. ................ 714/795 |
| 2001/0021233 | A1 | * | 9/2001 | Jin .............................. 375/341 |

OTHER PUBLICATIONS

Gross et al., Simplified MAP algorithm suitable for implementation of turbo decoders, Aug. 1998, IEEE, Electronic Letters, vol. 34, No. 16, p. 1577–1578.*
Viterbi, An intutive justification and a simplified implementation of the MAP decoder for convolutional codes, Feb. 1998, IEEE, Journal on Selected Areas in Comm. vol. 16, No. 2, p. 260–264.*
"A Turbo Code Tutorial", By William E. Ryan, Jan. 2000, 9 pages.

* cited by examiner

Primary Examiner—Shelly A Chase
(74) Attorney, Agent, or Firm—Christopher P. Maiorana PC

(57) ABSTRACT

A decoder generally comprising a branch metrics circuit and a state metrics circuit. The branch metrics circuit may be configured to generate a plurality of branch metric signals. The state metrics circuit may be configured to (i) add the branch metric signals to a plurality of state metric signals to generate a plurality of intermediate signals, (ii) determine a next state metric signal to the state metric signals, (iii) determine a normalization signal in response to the intermediate signals, and (iv) normalize the state metric signals in response to the normalization signal.

20 Claims, 3 Drawing Sheets

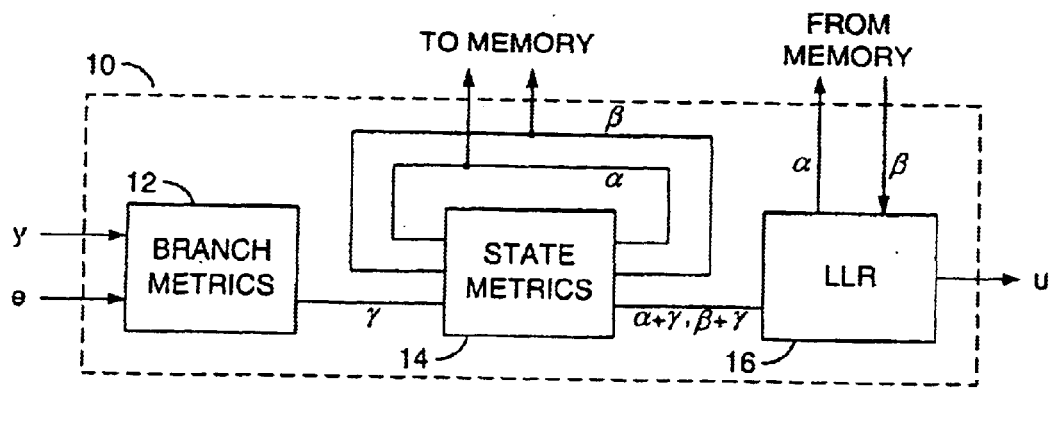
(CONVENTIONAL)
FIG. 1
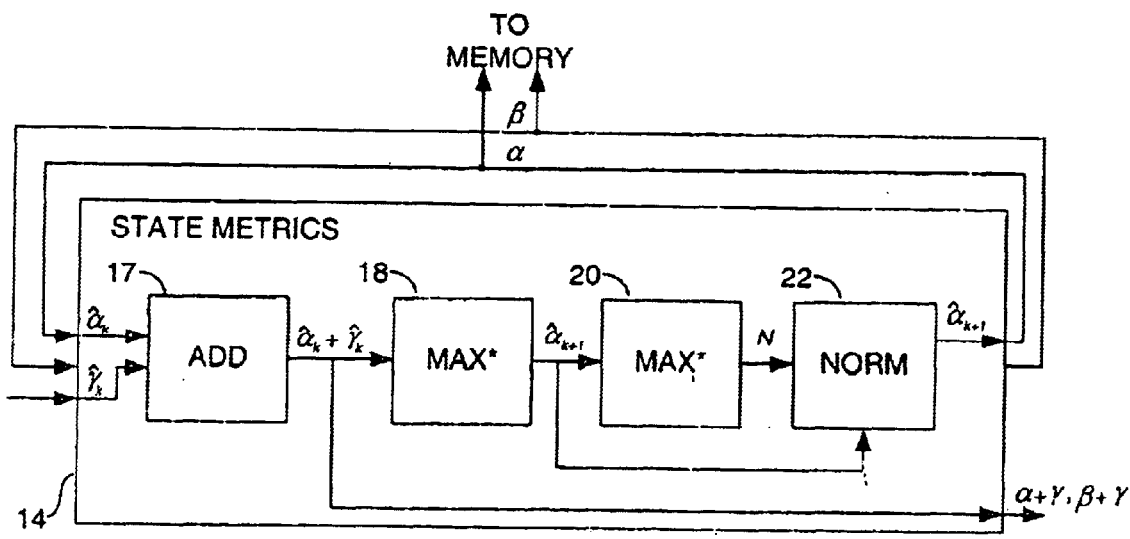
(CONVENTIONAL)
FIG. 2

US 6,871,316 B1

DELAY REDUCTION OF HARDWARE IMPLEMENTATION OF THE MAXIMUM A POSTERIORI (MAP) METHOD

FIELD OF THE INVENTION

The present invention relates to a method and/or architecture for a maximum a posteriori decoder generally and, more particularly, to a fast maximum a posteriori decoder that may be suitable for use in a turbo decoder.

BACKGROUND OF THE INVENTION

Conventional turbo decoders are created using two conventional maximum a posteriori (MAP) decoders. A conventional MAP decoder implements equations 1–4 as follows:

$$\log_e \Lambda_k = \log_e \frac{\sum_{u_k=+1} p(u, y)}{\sum_{u_k=-1} p(u, y)} \qquad \text{Eq. (1)}$$

$$= \frac{\sum_{u_k=+1} \alpha_k^{s'} \gamma_k^{s',s} \beta_{k+1}^{s}}{\sum_{u_k=-1} \alpha_k^{s'} \gamma_k^{s',s} \beta_{k+1}^{s}}$$

$$\alpha_{k+1}^s = \sum_{s'} \alpha_k^{s'} \gamma_k^{s',s} \qquad \text{Eq. (2)}$$

$$\beta_k^{s'} = \sum_s \gamma_k^{s',s} \beta_{k+1}^s \qquad \text{Eq. (3)}$$

$$\gamma^{s',s} = \exp\left[\sum_i y_i s_i\right] \qquad \text{Eq. (4)}$$

The variable $\Lambda_k$ is a ratio of a probability that a $k^{th}$ bit is +1 to a probability that the kth bit is −1, given an encoder input signal sequence u and a received signal sequence y, and $\log_e \Lambda_k$ is a log likelihood ratio (LLR). The variable $\alpha_k^{s'}$ is a forward state metric of state s'. The variable $\beta_{k-1}^{s}$ is a reverse state metric of state s. The state metrics $\alpha$ and $\beta$ are calculated recursively by the expressions shown in equations (2) and (3). The variable $\gamma_k^{s',s}$ is a branch metric, a quantity proportional to a probability that a transition is made from state s' to state s. The variable $y_i$ is an $i^{th}$ received noisy code word having the state $s_i$.

In a conventional hardware implementation, the product $\alpha_k^{s'} \gamma_k^{s',s} \beta_{k-1}^{s}$ of equation 1 is more efficiently implemented by a sum. The sum is accomplished by a transformation of the variables $\alpha$, $\beta$ and $\gamma$ by taking logarithms as shown in equations 5–7 as follows:

$$\hat{\alpha} = \log_e \alpha \qquad \text{Eq. (5)}$$

$$\hat{\beta} = \log_e \beta \qquad \text{Eq. (6)}$$

$$\hat{\gamma} = \log_e \gamma = \sum_i y_i s_i \qquad \text{Eq. (7)}$$

The products in the summations in equation 1 become additions as shown in equation 8 as follows:

$$\log_e \Lambda_k = \log_e \frac{\sum_{u_k=+1} e^{\hat{\alpha}_k^{s'}} e^{\hat{\gamma}_k^{s',s}} e^{\hat{\beta}_{k+1}^{s}}}{\sum_{u_k=-1} e^{\hat{\alpha}_k^{s'}} e^{\hat{\gamma}_k^{s',s}} e^{\hat{\beta}_{k+1}^{s}}} \qquad \text{Eq. (8)}$$

$$= \log_e \frac{\sum_{u_k=+1} \exp[\hat{\alpha}_k^{s'} + \hat{\gamma}_k^{s',s} + \hat{\beta}_{k+1}^{s}]}{\sum_{u_k=-1} \exp[\hat{\alpha}_k^{s'} + \hat{\gamma}_k^{s',s} + \hat{\beta}_{k+1}^{s}]}$$

Rather than summing the products of the state metrics and branch metrics, calculation of the LLR becomes a summation of the exponentials of the sum of the state metrics and branch metrics. The summation can be computed using conversions shown in equations 9 and 10 as follows:

$$\log_e(e^A + e^B) = \max(A, B) + \log(1 + e^{-|A-B|}) = \max^*(A, B) \qquad \text{Eq. (9)}$$

$$\max^*(A, B, C) = \max^*(\max^*(A, B), C) \qquad \text{Eq. (10)}$$

The maximum-log function (max*) can be interpreted as a maximum function max(A, B) with a correction factor $\log_e(1+e^{-|A-B|})$. With the conversions, the MAP decoder equations can be expressed in terms of max* functions. The forward state metric equation in terms of the max* function is shown in equations 11 and 12, for illustration, as follows:

$$\alpha_{k+1}^s = \sum_{s'} \alpha_k^{s'} \gamma_k^{s',s} \qquad \text{Eq. (11)}$$

$$\hat{\alpha}_{k+1}^s = \log_e \alpha_{k+1}^s = \log_e \sum_{s'} \alpha_k^{s'} \gamma_k^{s',s} \qquad \text{Eq. (12)}$$

$$= \log_e \sum_{s'} \exp[\alpha_k^{s'} + \gamma_k^{s',s}]$$

$$= \max^*\left(\sum_{s'} (\hat{\alpha}_k^{s'} + \hat{\gamma}_k^{s',s})\right)$$

Referring to FIG. 1, a conventional core circuit 10 of a conventional turbo decoder architecture is shown. A received bit signal (i.e., Y) and extrinsic information signal (i.e., E) are used to calculate branch metric signals (i.e., γ) in a branch metrics circuit 12. The branch metric signals γ are summed with state metric signals (i.e., $\alpha_i$ and $\beta_j$) in a state metrics circuit 14 to determine the state metrics for a next state metric signal (i.e., $\alpha_{i-1}$ and $\beta_{j-1}$). The sums (i.e., intermediate signals α+γ and β+γγ are also passed onto a log likelihood ratio (LLR) circuit 16. The LLR circuit 16 calculates multiple log likelihood ratios that determined the most likely data transitions. The LLR circuit 16 then presents the most likely data transitions in a data signal (i.e., U).

A bottleneck of the conventional turbo decoder core circuit 10 is the state metrics circuit 14. Because of the recursive nature of operations within the state metrics circuit 14, introduction of pipeline architecture cannot improve the overall throughput of the core circuit 10. Successive state metrics are calculated in a specific sequence.

Referring to FIG. 2, a detailed block diagram of the conventional state metrics circuit 14 is shown. The state metrics circuit 14 performs multiple operations, an addition 17, a maximum-log (MAX*) operation 18, a maximum (MAX) operation 20, and a normalization (NORM) operation 22. Values of the forward state metric signals $\hat{\alpha}_k$ and the branch metric signals $\hat{\gamma}_k$ are summed 17 and the max* function applied in the maximum-log operation 18 to generate a next forward state metric signal $\hat{\alpha}_{k+1}'$. Calculation of a next reverse state metric signal (not shown) is performed in a similar manner. The maximum operation 20 is then performed on the next forward state metric signal $\hat{\alpha}_{k+1}'$ to generate a normalization signal (i.e., N).

The value of the next forward state metric signal $\hat{\alpha}_{k+1}'$ needs to be normalized because the next forward state metric signal $\hat{\alpha}_{k+1}'$ is representing numbers with a finite number of bits. All of the original forward state metric signals α are also normalized to maintain a proper relative amplitude. The next forward state metric signal $\alpha_{k+1}'$ and the forward state metric signals α are then normalized by a value of the normalization signal N in the normalization operation 22. Since the normalization operation 22 depends on the results of the maximum-log operation 18 and the maximum operation 20, the steps executed by the circuits 18, 20, and 22 are inherently sequential. For example, a conventional core circuit 10 fabricated by a conventional 0.25 micron technology resulted in a synthesized delay of 16.3 nanoseconds.

SUMMARY OF THE INVENTION

The present invention concerns a decoder generally comprising a branch metrics circuit and a state metrics circuit. The branch metrics circuit may be configured to generate a plurality of branch metric signals. The state metrics circuit may be configured to (i) add the branch metric signals to a plurality of state metric signals to generate a plurality of intermediate signals, (ii) determine a next state metric signal to the state metric signals, (iii) determine a normalization signal in response to the intermediate signals, and (iv) normalize the state metric signals in response to the normalization signal.

The objects, features and advantages of the present invention include providing a maximum a posteriori decoder that may (i) reduce a delay through a turbo decoder core circuit, (ii) occupy less space and/or (iii) require fewer decoders to meet a specific baud rate requirement.

BRIEF DESCRIPTION OF THE DRAWINGS

These and other objects, features and advantages of the present invention will be apparent from the following detailed description and the appended claims and drawings in which:

FIG. 1 is a block diagram of a conventional core circuit for a turbo decoder circuit;

FIG. 2 is a block diagram illustrating an operation of the conventional core circuit;

DETAILED DESCRIPTION OF THE PREFERRED EMBODIMENTS

Figure 3:
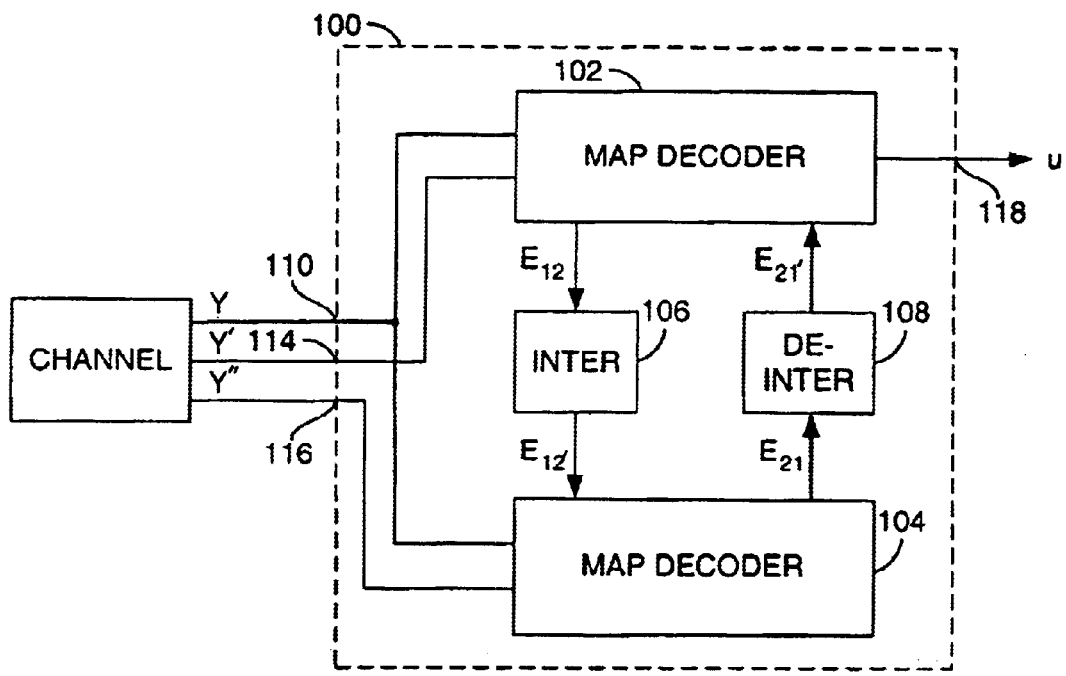
FIG. 3 is a block diagram of a turbo decoder circuit.

Referring to FIG. 3, a block diagram of a turbo decoder circuit 100 is shown in accordance with a preferred embodiment of the present invention. The turbo decoder circuit 100 generally comprises a circuit 102, a circuit 104, a circuit 106, and a circuit 108. A signal (e.g., Y) may be received at an input 110 of the turbo decoder circuit 100 through a channel 112. Another signal (e.g., Y') may be received at an input 114 of the turbo decoder circuit 100 through the channel 112. A signal (e.g., Y") may be received at an input 116 of the turbo decoder circuit 100 through the channel 112. The turbo decoder circuit 100 may have an output 118 to present a signal (e.g., U).

The signal Y may represent data carried through the channel 114. The signal Y' may represent parity information for the signal Y. The signal Y" may represent more parity information for the signal Y that has been interleaved with respect to the signal Y. The signals Y, Y' and Y" may include noise induced by the channel 112. The signal U may represent the data extracted from the signals Y, Y' and Y" as determined by the turbo decoder circuit 100.

The circuit 102 may be implemented as a maximum a posteriori (MAP) decoder circuit. The MAP decoder circuit 102 may receive the signal Y. The MAP decoder circuit 102 may also receive the signal Y'. The MAP decoder circuit 102 may present the signal U. A signal (e.g., $E_{12}$) may be generated by the MAP decoder circuit 102 and presented to the circuit 106. A signal (e.g., $E_{21}'$) may be received by the MAP decoder circuit 102 from the circuit 108.

The circuit 104 may be implemented as another MAP decoder circuit. The MAP decoder circuit 104 may receive the signal Y. The MAP decoder circuit 104 may receive the signal Y". A signal (e.g., $E_{12}'$) may be received by the MAP decoder circuit 104 from the circuit 106. A signal (e.g., $E_{21}$) may be generated by the MAP decoder circuit 104 and presented to the circuit 108.

The circuit 106 may be implemented as an interleave circuit. The interleave circuit 106 may interleave the signal $E_{12}$ to generate and present the signal $E_{12}'$. The signal $E_{12}$ may be soft or extrinsic information generated by the MAP decoder circuit 102 for use by the MAP decoder circuit 104.

The circuit 108 may be implemented as a de-interleave circuit. The de-interleave circuit 108 may de-interleave the signal $E_{21}$ to generate and present the signal $E_{21}'$. The signal $E_{21}$ may be soft or extrinsic information generated by the MAP decoder circuit 104 for use by the MAP decoder circuit 102. The MAP decoder circuits 102 and 104 may thus operate as iterative soft-output decoders within the turbo decoder circuit 100.

The channel 112 may be implemented as any type of channel that may convey data. For example, the channel 112 may include, but is not limited to, radio-frequency channels, fiber optic channels, infrared communication channels, and the like. Other types of channels may be used with the present invention to meet the design criteria of a particular application. Multiple turbo decoder circuits 100 may be coupled to the channel 112 where the channel 112 has an ability to deliver information faster than a single turbo decoder circuit 100 can decode the signals Y, Y', and Y".

Figure 4A:
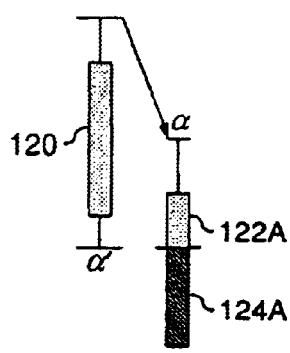
FIGS. 4A–C are diagrams illustrating normalization methods.
Figure 4B:
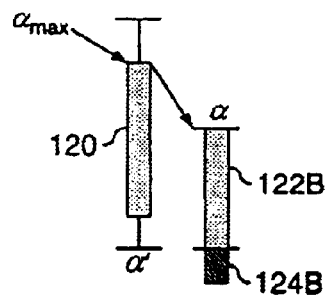
Figure 4C:
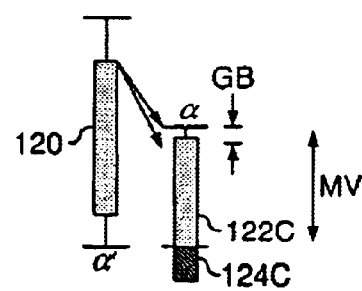

Referring to FIGS. 4A–C, diagrams illustrating normalization methods are shown. The FIG. 4A is a diagram illustrating a bit truncation type of normalization method. The bit truncation method is generally fast, but performance of the turbo decoder circuit 100 generally suffers. By way of example, a next forward state metric signal (e.g., α'), represented by m bits and having a data range 120, may be truncated/normalized to generate a normalized forward state metric signal (e.g., α) represented by m–1 bits. The truncation approach subtracts $2^{m-1}$ from the next forward state metric signal α', assigning a zero (0) value to the normalized forward state metric signal α if the subtraction results in a negative value.

While the bit truncation method may be simple and fast when implemented in hardware, the performance of the truncation method generally suffers due to increased bit error rate (BER) resulting from the loss in dynamic range of the normalized forward state metric signal α. It may be apparent that the entire data range 120 may be completely represented by the (m-bit) next forward state metric signal α'. In contrast, an effective data range 122A of the (m−1 bit) normalized forward state metric signal α may be significantly lower than the data range 120. Furthermore, a large portion 124A of the next forward state metric signal α' may be lost.

Referring to FIG. 4B, a diagram illustrating a maximum-range type normalization method is shown. The maximum-range normalization method may first determine a maximum value (e.g., αmax) of the next forward state metric signal α'. An amount (e.g., $\alpha_{max}-2^{m-1}$) may then be subtracted from the normalized and all other forward state metric signals a of a data set, again assigning a zero (0) value if the subtraction results in a negative value.

The maximum-range approach may use a maximum dynamic range offered by the normalized forward state metric signal α, at the expense of a delay because the max* function calculation and the maximum-range normalization calculation may be performed sequentially. The maximum-range method may subtract a smaller amount from the original next forward state metric signal α' than the bit truncation method. As a result, an effective data range 122B of the normalized forward state metric signal α may be larger for the maximum-range method than the effective data range 122A for the bit truncation method. Likewise, a portion 124B of the next forward state metric signal α' lost by the maximum-range method may be smaller than the portion 124A lost by the bit truncation method.

Referring to FIG. 4C, a diagram illustrating a parallelization type of normalization method is shown. A similarity of the max* function to the maximum function generally allows the performance of the turbo decoder circuit 100 to be retained and the hardware delay reduced at the same time. The parallelization method may normalize by a maximum value determined by (α+γ) rather than a maximum value determined by α' or max*(α+γ). The normalization operation and max* function computation may thus be performed in parallel simultaneously.

A general difference between the parallelization approach and the maximum-range method is that the maximum function neglects the correction factor of the max* function. To account for the correction factor, the parallelization method may further adjusts the normalization operation by a guard band value (e.g., GB) to determined the normalized forward state metric signal α. The guard band value GB may be determined by the correction factor of the max* function. In the example shown in FIG. 4C, the normalized forward state metric signal α may be represented by seven (7) bits for a maximum possible value (e.g., MV) of 127 and the determined guard band value GB may have a value twelve (12). An effective data range 122C of the normalized forward state metric signal a may be slightly smaller for the parallelization method than the effective data range 122B for the maximum-range method. A lost portion 124C of the original next forward state metric signal α may be slightly larger for the parallelization method than the lost portion 124B for the maximum-range method.

Simulations of bit error rates (BER) as a function of a signal to noise ratio (SNR) for the maximum-range and the parallelization normalization methods have been performed for comparison purposes. The simulations generally show that the BER performance for a turbo decoder are equally good for the two methods. In general, the BER does not change when implementing the maximum-range normalization method or the parallelization normalization method.

Figure 5:
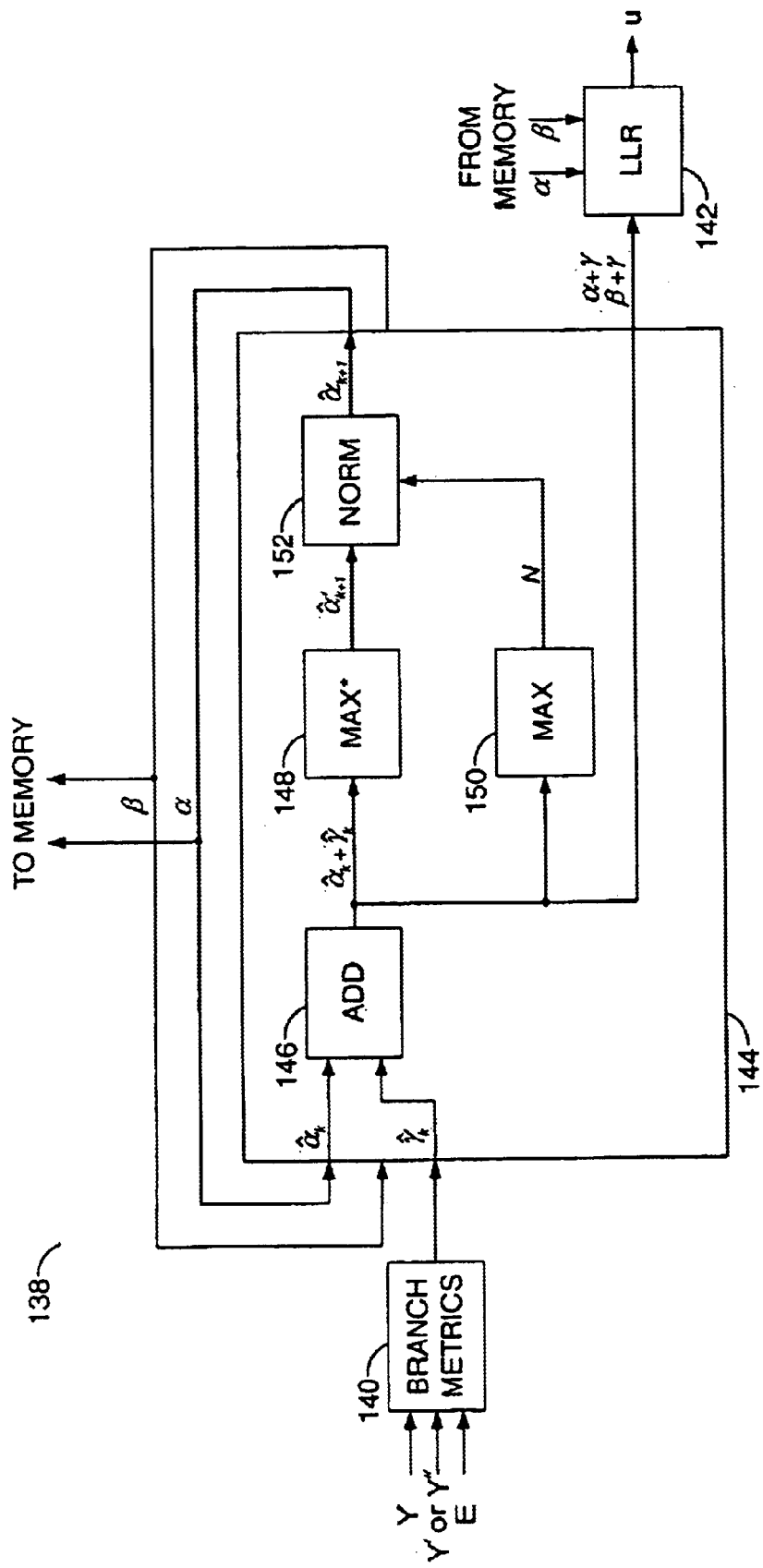
FIG. 5 is a block diagram of a core circuit according to the present invention.

Referring to FIG. 5, a block diagram of a circuit 138 implementing a preferred embodiment of the present invention is shown. The circuit 138 may represent a core circuit in each of the MAP decoder circuits 102 and 104 of the turbo decoder 100. The core circuit 138 generally comprises a circuit 140, a circuit 142, and a circuit 144.

The circuit 140 may be implemented as a branch metrics circuit. The branch metrics circuit 140 may receive several signals (e.g., Y, Y', Y" and E). The branch metrics circuit 140 may operate similar to the branch metrics circuit 12 to generate and present multiple branch metric signals (e.g., γ) in response to the signals Y, Y' or Y" and E. The branch metric signals γ may be implemented as a fixed-point variables in a hardware implementation.

The circuit 142 may be implemented as a log likelihood ratio (LLR) circuit. The LLR circuit 142 may receive the state metric signals α and β. The LLR circuit 142 may also receive multiple intermediate signals (e.g., α+γ and β+γ). The LLR circuit 142 may operate similar to the LLR circuit 16 to generate and present the data signal U in response to (i) the state metric signals α and β and (ii) the intermediate signals α+γ and β+γ. The state metric signals α and β may be implemented as fixed-point variables in the hardware. The intermediate signals α+γ and β+γ may also be implemented as fixed-point variables in the hardware.

The circuit 144 may be implemented as a state metrics circuit. The state metrics circuit 144 may receive the state metric signals α and β. The state metrics circuit 144 may also receive the branch metric signals $\hat{\gamma}_k$. The state metrics circuit 144 may iterate calculations of the state metric signals α and β and the intermediate signals α+γ and β+γ to determine normalized and then most likely values. The state metric signals α and β presented by the state metrics circuit 144 may be stored in a memory circuit (not shown). The state metric signals α and β may be implemented as fixed-point variables in the hardware.

The state metrics circuit 144 generally comprises a circuit 146, a circuit 148, a circuit 150 and a circuit 152 to determine the forward state metric signals α. Similar circuits (not shown) may be included in the state metrics circuit 144 to determine the backward state metric signals β. Each of the circuits 146, 148, 150 and 152 may be implemented with fixed-point variables. Likewise, each signal received, generated, and/or presented by each of the circuits 146, 148, 150 and 152 may be represented by fixed-point variables.

The circuit 146 may be implemented as an adding circuit. The adding circuit 146 may receive the forward state metric signals $\hat{\alpha}_k$. The adding circuit 146 may also receive the branch metric signals $\hat{\gamma}_k$. The adding circuit 146 may add the forward state metric signals $\hat{\alpha}_k$ and the branch metric signals $\hat{\gamma}_k$ to generate intermediate signals $\hat{\alpha}_k+\hat{\gamma}_k$. The intermediate signals $\hat{\alpha}_k+\hat{\gamma}_k$ may be presented to the circuit 148, the circuit 150 and the LLR circuit 142 simultaneously.

The circuit 148 may be implemented as a maximum-log circuit. The circuit 148 may receive the intermediate signals $\hat{\alpha}_k+\hat{\gamma}_k$. The circuit 148 may be configured to perform the maximum-log (max*) operation on the intermediate signals $\hat{\alpha}_k+\hat{\gamma}_k$ to generate the next forward state metric signal $\hat{\alpha}_{k+1}'$. The next forward state metric signal $\hat{\alpha}_{k+1}'$ and all other existing forward state metric signals α may be presented to the circuit 152 for normalization to avoid an overflow of the fixed-point variables.

The circuit 150 may be implemented as a maximum circuit. The maximum circuit 150 may be configured to perform the maximum operation on the intermediate signals $\hat{\alpha}_k+\hat{\gamma}_k$ to generate a signal (e.g., N). The signal N may be implemented as a normalization factor signal. The signal normalization factor N may be presented to the circuit 152.

The normalization factor signal N may be generated independently of the correction factor used in the maximum-log circuit 148. Therefore, the maximum circuit 150 may operate simultaneously with the maximum-log circuit 148. The ability of the maximum-log circuit 148 and the maximum circuit 150 to operate in parallel generally allows the state metrics circuit 144 to iterate the state metric signals α and β with a shorter delay than the conventional state metrics circuit 14.

The circuit 152 may be implemented as a normalization circuit. The normalization circuit 152 may simultaneously receive the next forward state metric signal $\hat{\alpha}_{k+1}$ from the maximum-log circuit 148, the normalization factor signal N from the maximum circuit 150, and the existing forward state metric signals α. The normalization circuit 152 may be configured to normalize the next forward state metric signal $\hat{\alpha}_{k+1}$ and the forward state metric signals α to generate an iterated set of the state metric signals α. The parallelization normalization method may be implemented to generate the iterated set of the state metric signals α. The state metric signals α may then be stored in the memory circuit (not shown) and then reiterated multiple times using the extrinsic information from the signals $E_{12}'$ and $E_{21}'$ to improve a probability of detecting the data within the signal Y. Other designs of the normalization circuit 152 may be implemented to meet the design criteria of a particular application.

Including a compiler optimized maximum-log (max*) function and the parallelization, an example delay of the turbo decoder core circuit 138 may be reduced to approximately 9.1 nanoseconds, which is generally 45% less than the original delay of 16.3 ns for the conventional core circuit 10. The increase in speed generally means that fewer turbo decoder circuits 100 may be needed to meet any specific baud rate requirement of a particular application. Performance examples of the conventional core circuit 10 and the core circuit 138 of the present invention are shown in Table I.

TABLE I

|  | Conventional | Optimized |
|---|---|---|
| Turbo Core circuit | | |
| Delay (ns) | 16.3 | 9.1 |
| Overall | | |
| No. of decoders at 21 Mbaud/s (6 iterations) | 6 | 4 |
| No. of decoders at 45 Mbaud/s (6 iterations) | 10 | 6 |
| No. of decoders at 21 Mbaud/s (8 iterations) | 7 | 5 |
| No. of decoders at 45 Mbaud/s (8 iterations) | 13 | 8 |

As used herein, the term "simultaneously" is meant to describe events that share some common time period but the term is not meant to be limited to events that begin at the same point in time, end at the same point in time, or have the same duration.

The various signals of the present invention may be implemented as single-bit or multi-bit signals in a serial and/or parallel configuration.

While the invention has been particularly shown and described with reference to the preferred embodiments thereof, it will be understood by those skilled in the art that various changes in form and details may be made without departing from the spirit and scope of the invention.

What is claimed is:

1. A decoder comprising:
   a branch metrics circuit configured to generate a plurality of branch metric signals; and
   a state metrics circuit configured to (i) add said branch metric signals to a plurality of state metric signals to generate a plurality of intermediate signals, (ii) determine a next state metric signal to said state metric signals calculated from said intermediate signals, (iii) determine a normalization signal calculated from said intermediate signals, and (iv) normalize said state metric signals in response to said normalization signal.

2. The decoder according to claim 1, wherein determining said next state metric signal and determining said normalization signal are performed in parallel.

3. The decoder according to claim 1, wherein determining said next state metric signal is a maximum operation of said intermediate signals with a correction factor.

4. The decoder according to claim 3, wherein determining said normalization signal is a maximum operation of said intermediate signals independent of said correction factor.

5. The decoder according to claim 3, wherein said state metrics circuit is further configured to reduce said normalization signal in response to said correction factor.

6. The decoder according to claim 1, wherein each of said state metric signals is represented by a fixed point variable.

7. The decoder according to claim 6, wherein said state metrics circuit is further configured to adjust said normalization signal to prevent an overflow of said state metric signals.

8. The decoder according to claim 1, wherein said normalization signal is adjusted in response to a correction factor used in determining said next state metric signal.

9. The decoder according to claim 1, wherein (i) determining said next state metric signal and determining said normalization signal are performed in parallel, (ii) determining said next state metric signal is a maximum operation of said intermediate signals with a correction factor, and (iii) determining said normalization signal is a maximum operation of said intermediate signals.

10. The decoder according to claim 1, further comprising a second decoder coupled to said decoder to form a turbo decoder.

11. A maximum a posteriori decoding method, comprising the steps of:
   (A) adding a plurality of branch metric signals to a plurality of state metric signals to generate a plurality of intermediate signals;
   (B) determining a next state metric signal to said state metric signals calculated from said intermediate signals;
   (C) determining a normalization signal calculated from said intermediate signals; and
   (D) normalizing said state metric signals in response to said normalization signal.

12. The method according to claim 11, wherein said steps of determining said next state metric signal and determining said normalization signal are performed in parallel.

13. The method according to claim 11, wherein step (B) comprises the sub-step of:
   performing a first maximum operation on said intermediate signal.

14. The method according to claim 13, wherein step (B) further comprises the sub-step of:
   adding a correction factor after performing said maximum operation.

15. The method according to claim 14, wherein step (C) further comprises the sub-step of performing a second maximum operation on said intermediate signals independent of said correction factor.

16. The method according to claim 14, further comprising the step of reducing said normalization signal in response to said correction factor.

17. The method according to claim 11, further comprising the step of representing each of said state metric signals, said branch metric signals, said intermediate signals, and said normalization signal as a fixed point variable.

18. The method according to claim 11, further comprising the step of adjusting said normalization signal to prevent an overflow of said state metric signals.

19. The method according to claim 18, wherein said normalization signal is adjusted in response to a correction factor used in determining said next state metric signal.

20. A decoder comprising:

means for adding a plurality of branch metric signals to a plurality of state metric signals to generate a plurality of intermediate signals;

means for determining a next state metric signal to said state metric signals in response to said intermediate signals;

means for determining a normalization signal in response to said intermediate signals; and means for normalizing said state metric signals in response to said normalization signal.

* * * * *